(12) United States Patent
Detlefsen (10) Patent No.: US 8,068,001 B2
(45) Date of Patent: Nov. 29, 2011

(54) SAW FILTER FEATURING IMPEDANCE TRANSFORMATION

(75) Inventor: Andreas Detlefsen, Eichenau (DE)

(73) Assignee: EPCOS AG, Munich (DE)

( * ) Notice: Subject to any disclaimer, the term of this patent is extended or adjusted under 35 U.S.C. 154(b) by 440 days.

(21) Appl. No.: 11/576,732

(22) PCT Filed: Sep. 21, 2005

(86) PCT No.: PCT/EP2005/010220
§ 371 (c)(1),
(2), (4) Date: Jan. 7, 2008

(87) PCT Pub. No.: WO2006/037477
PCT Pub. Date: Apr. 13, 2006

(65) Prior Publication Data
US 2008/0246560 A1    Oct. 9, 2008

(30) Foreign Application Priority Data
Oct. 6, 2004    (DE) .......................... 10 2004 048 715

(51) Int. Cl.
*H03H 9/64* (2006.01)
(52) U.S. Cl. ........................ 333/195; 333/32; 310/313 D
(58) Field of Classification Search .......... 333/193–196, 333/32; 310/313 R, 313 B, 313 C, 313 D
See application file for complete search history.

(56) References Cited

U.S. PATENT DOCUMENTS

| | | | |
|---|---|---|---|
| 3,600,710 A | 8/1971 | Adler et al. | |
| 4,425,554 A * | 1/1984 | Morishita et al. | 333/195 |
| 5,790,000 A * | 8/1998 | Dai et al. | 333/193 |
| 6,353,372 B1 | 3/2002 | Baier et al. | |
| 6,667,673 B1 * | 12/2003 | Strauss | 333/195 |
| 6,759,928 B2 | 7/2004 | Endou | |
| 6,768,397 B2 * | 7/2004 | Takamine | 333/193 |
| 6,894,588 B2 | 5/2005 | Detlefsen | |
| 7,042,132 B2 | 5/2006 | Bauer et al. | |
| 2002/0079988 A1 * | 6/2002 | Endou et al. | 333/193 |
| 2002/0109431 A1 * | 8/2002 | Yata et al. | 310/314 |

(Continued)

FOREIGN PATENT DOCUMENTS

DE    19724259    12/1998

(Continued)

OTHER PUBLICATIONS

English language Machine Translation of JP 2001-292050 published Oct. 19, 2001.*

(Continued)

*Primary Examiner* — Barbara Summons
(74) *Attorney, Agent, or Firm* — Fish & Richardson P.C.

(57) ABSTRACT

A surface acoustic wave (SAW) filter includes at least one first electroacoustic transducer, and at least one second electroacoustic transducer. The at least one first electroacoustic transducer and the at least one second electroacoustic transducer are side-by-side inside an acoustic path having an aperture $A_0$. The at least one first electroacoustic transducer is connected to an electrical output of the SAW filter, and the at least one second electroacoustic transducer is connected to an electrical input of the SAW filter. At least one first electroacoustic transducer comprises a series circuit of a number of partial transducers, wherein each partial transducer has an individual aperture that is reduced in relation to the overall aperture $A_0$, and wherein the individual apertures add up to the overall aperture.

8 Claims, 5 Drawing Sheets

U.S. PATENT DOCUMENTS

| | | | |
|---|---|---|---|
| 2003/0122449 A1* | 7/2003 | Bergmann | 310/313 B |
| 2003/0231083 A1 | 12/2003 | Detlefsen | |
| 2004/0090145 A1 | 5/2004 | Bauer et al. | |
| 2004/0233018 A1 | 11/2004 | Watanabe et al. | |
| 2006/0097824 A1 | 5/2006 | Detlefsen | |

FOREIGN PATENT DOCUMENTS

| | | | |
|---|---|---|---|
| DE | 198 18 826 | | 11/1999 |
| EP | 06 05884 | | 12/1993 |
| EP | 1 227 584 | | 7/2002 |
| EP | 1 249 934 | | 10/2002 |
| EP | 1 341 304 | | 9/2003 |
| JP | 58-182313 | | 10/1983 |
| JP | 10-173470 | * | 6/1998 |
| JP | 2001-24471 | * | 1/2001 |
| JP | 2001-292050 | * | 10/2001 |
| JP | 2002-503414 | | 1/2002 |
| JP | 2002-300005 | | 10/2002 |
| JP | 2002-374142 | | 12/2002 |

OTHER PUBLICATIONS

Written Opinion with translation for PCT/EP02/010220 and International Search Report mailed Dec. 2005.

International Preliminary Report on Patentability in Application No. PCT/EP2005/010220, dated Apr. 24, 2007.

English Translation of Notification of Reasons for Refusal in Japanese Patent Application No. 2007-535045, dated Feb. 25, 2011.

* cited by examiner

ANT = antenna
SW = antenna switch
F = filter
AMP = amplifier

SAW FILTER FEATURING IMPEDANCE TRANSFORMATION

TECHNICAL FIELD

This patent application describes a SAW filter, such as a dual-mode SAW filter, also called a DMS filter, which may be used in the front end of radio equipment.

BACKGROUND

A series circuit, antenna-antenna switch-Rx filter-matching circuit-LNA-mixer, is usually present in the receive path, referred to as the Rx path, of cell phones. For the front end of cell phones, which contains at least part of the Rx path, complete chipsets or even modules are offered that comprise individual components matched to one another, or are integrated circuits, or contain several or all components integrated on one module. Because of their reasonable prices, CMOS circuits are being increasingly used for the LNA (Low Noise Amplifier). Such LNAs have input impedances of, for instance, 800Ω or more. They have at least one bad noise figure, so that an input signal with as high an amplitude as possible, i.e., low attenuation, is required to meet the requirements of the overall system.

SAW filters with a real output impedance of typically up to 200Ω are used for the Rx branch and also for the TX branch for cell phones. Matching to the LNA with the higher input impedance is achieved with external components, which, however, have finite figures of merit and therefore produce losses. Integrating these matching components entirely or partially into modules is a known measure for minimizing these losses. Nevertheless, it is necessary to accept losses of typically 2.0 dB in the front end of cell phones from the SAW filter alone, and typically ca. 1.0 dB in addition from the external matching for impedance transformation to the actual 800Ω.

A DMS filter in which the impedance of the input or output filter is determined by weighting is known from U.S. Pat. No. 6,353,372 A. This transducer is divided into two partial transducers connected in series at least in part. The division of the input or output transducer into two partial transducers can be done horizontally, the partial transducers then being arranged side by side transversally in the acoustic path. It is also possible to divide the partial transducers vertically into two partial transducers, the partial transducers then being arranged side by side longitudinally inside the acoustic path. In case of a division into two partial transducers in which the size of the overall transducer, including the number of fingers, remains unchanged, one then achieves an impedance transformation between input side and output side by a factor of 4 in both cases.

To match an input filter between an antenna with a 50Ω impedance and an LNA with an input impedance of 800Ω, however, a higher impedance transformation, which cannot be achieved with known SAW filters, is necessary.

SUMMARY

Described herein is a SAW filter in which at least one first and one second electroacoustic transducer are arranged inside an acoustic path having an aperture $A_0$. If the total number of electroacoustic transducers is more than two, then the transducers are arranged alternately side by side. The first transducer or transducers is connected to the electrical output side and the second transducer or transducers is connected to the electrical input side. The first transducer here comprises a series circuit of n partial transducers, which are obtained by horizontal subdivision of the transducer into individual apertures with lesser individual apertures $A_j$. The sum of the individual apertures is equal to the aperture $A_0$ of the acoustic path. If more than one first transducer is present, then at least two of the first transducers are electrically connected in series.

In this manner, a SAW filter of the DMS type is obtained that can supply a balanced signal on the electrical output side and therefore can be operated symmetrically on this side. Such a filter can be advantageously used in the Rx path of a communication device, in particular, a cell phone. It has a higher integrated impedance matching which, in particular, can be set to a value of at least 6. Impedance transformations by a factor of 8 or 9 are obtained even with simple configurations. Thus a simple and more stable matching of the filter to the usual differential amplifiers on a CMOS basis with generally high impedance is achieved.

All first transducers may be subdivided in the same manner into partial transducers. "In the same manner" indicates here that all partial transducers are subdivided into the same number of partial transducers, the latter having identical individual apertures. Such a filter is constructed symmetrically, therefore facilitating the electrical connection of the first transducers to the electrical output side.

A first transducer may be subdivided in the propagation direction of the surface wave into sequentially arranged transducer sections electrically connected in parallel. The transducer sections are subdivided at least in part into partial transducers, with differing numbers of partial transducers per transducer section in the first transducer.

The input transducer can be subdivided into transducer sections with differing numbers of partial transducers by one or more central current bus bars which, viewed parallel to the propagation direction of the surface wave, extend over one of the transducer sections. At least one of the other transducer sections has no such central current bus bars. The number of partial transducers is increased by one per inserted central current bus bar, so that there is a subdivision into n+1 partial transducers for n central current bus bars.

A SAW filter can comprise several first transducers. All current bus bars of all first transducers on one side of the acoustic path may be connected to the electrical output side, for instance, to the symmetric terminals of the output, while all those on the other side of the acoustic path may be connected to ground. If the first transducers are connected on the electrical output side to a symmetric terminal, then in case more than two first transducers are present, they are divided into two groups, each assigned to one of the two symmetric terminals. If more than one first transducer is provided, then the number of first transducers is even, so that an easy subdivision into two groups can be realized. Inside each group, the transducers assigned to a terminal of the symmetric port are electrically connected in parallel to one another.

Consequently, four, six, eight or more first transducers are present in a SAW filter with more than two first transducers. At least for half of a filter, the first transducers are arranged alternately with the second transducers in such a manner that, with regard to the arrangement, an axis of symmetry transverse to the propagation direction of the acoustic wave can be determined. On both sides of the axis of symmetry, the transducers on the electrical output side are electrically connected in two parallel branches, as mentioned above. In conformity therewith, two possibilities result for the connection on the other side of the acoustic path. All transducers can be connected to ground on the input side. It is also possible to connect the two innermost first transducers—closest to the axis of symmetry—in series electrically, but the other first transducers on the electrical input side to ground. A second transducer can be arranged between the two series-connected innermost first transducers. In another embodiment, the two innermost first transducers are directly adjacent to one another.

In another embodiment, only one first transducer that is divided into more than two partial transducers in the transversal direction is provided. The two outer current bus bars of this first transducer are connected here to the symmetric terminals, so that these transducers can be operated differentially.

In an additional embodiment, an odd number of first transducers is provided in the filter. Relative to the arrangement of all the transducers, the filter has an axis of symmetry which also symmetrically divides the central transducer, which is a first transducer, into two transducer halves operating with opposite phase to one another. An outer current bus bar of the central transducer is electrically interrupted and thus subdivided into two halves, with each half of the current bus bar being connected to one of the two symmetric terminals of the electrical output side. The two halves of the transducer are electrically connected in series via the undivided other current bus bar.

It is also possible for each of the two halves to be additionally subdivided into partial transducers in series, with the subdivision being undertaken in the transversal direction, perpendicular to the propagation direction of the surface wave.

The transducer halves of the central first transducer that are obtained by subdivision of a current bus bar can each be connected in parallel on the output side to an additional first transducer. On the input side, this additional first transducer is then connected to ground.

In one embodiment, all second transducers are electrically connected in parallel, and connected on the input side to an asymmetric terminal. The parallel second transducers are thus connected single-ended to ground.

A filter functions according to the DMS principle, in which the acoustic path is advantageously bounded by a reflector structure at each end. The reflector structure can comprise a grating of electrically short-circuited metallization strips that are free floating, and optionally connected to a reference potential.

Because of the reciprocal behavior of SAW filters and SAW structures, it is clear that a filter is also capable of operating with polarity-reversed or inverted terminals. It is therefore possible to connect the first transducers to the electrical input side, and the second transducers to the electrical output side.

A filter is advantageously applied in the receive branch of a radio device. It may be arranged there between an antenna and an amplifier (LNA).

A filter according to the invention can be cascaded with other identically or similarly constructed filters. It is possible, for instance, to connect two preferably identical filters according to the invention in series such that terminals of the same type are connected to one another. The differential terminals of the electrical output side of a first filter are preferably connected to the differential terminals of the input side of the second filter. The input side of the first filter is then connected to the input of the arrangement, and the output side of the second filter to the output of the arrangement.

Resonators can be connected in parallel or in series with filters. It is also possible to connect resonators in parallel and in series with a filter at the same time.

Embodiments are described below with reference to associated figures. The figures serve only for better illustration and are therefore drawn only schematically and not to scale. Identical or identically functioning parts are furnished with identical reference characters.

DETAILED DESCRIPTION

Figure 1A:
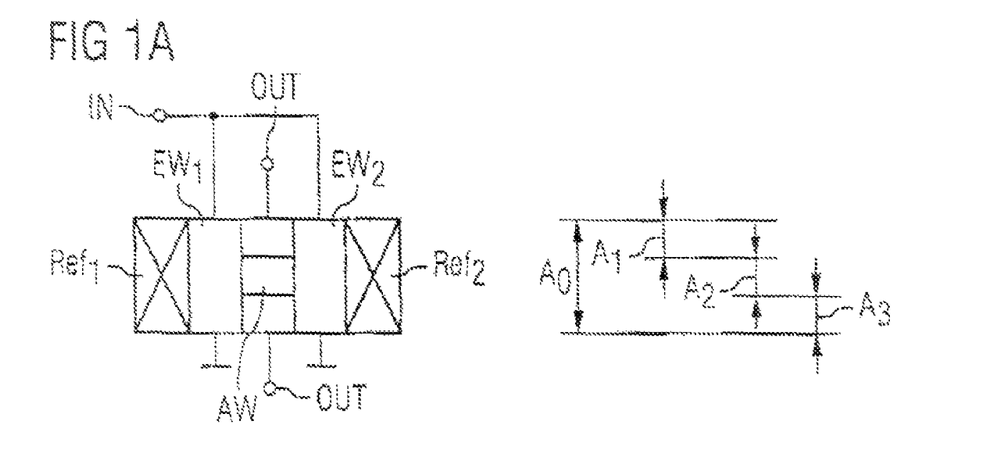
FIG. 1 shows a SAW filter with three transducers in a schematic representation.

FIG. 1A shows a first embodiment. The SAW filter is constructed from two second transducers (input transducers) $EW_1$, $EW_2$ and one first transducer (output transducer) AW, which are arranged side by side inside the common acoustic path. The acoustic path is bounded at both ends by a respective reflector REF. Second transducers $EW_1$, $EW_2$ are arranged on each side of first output transducer AW, in a single-ended connection on one side to an input IN and grounded on the other side. First transducer AW is subdivided in the transversal direction (perpendicular to the propagation direction of the acoustic wave) into three partial transducers. The acoustic path and thus all transducers have a total aperture $A_0$. The individual apertures $A_1$, $A_2$, $A_3$ for the three partial transducers likewise add up to the total aperture $A_0$.

Figure 11:
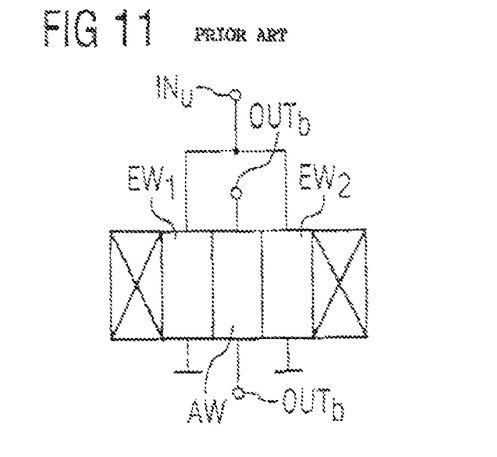
FIG. 11 shows a known SAW filter with three transducers, which is balanced at both ends.

FIG. 11, in contrast, shows a known filter, in which a single undivided first transducer AW is arranged between two parallel-connected second transducers EW, and is connected to a symmetric output OUT. With a standard impedance $Z_0$, an input impedance $Z_E$ of $Z_0/2$ results, but at the output there is an impedance $Z_A$ of $Z_0$, and thus an impedance transformation by a factor of 2. Usually, however, there is a deviation from the standard impedance $Z_0$ by a reduction of the number of fingers of EW, and thus $Z_A=Z_E$ is achieved.

Figure 1B:
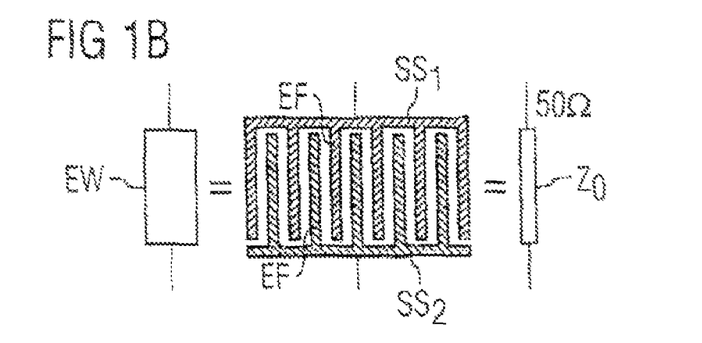

The symbols used in FIG. 1A are additionally shown in another manner in FIGS. 1B-1D for further explanation. In the representation at the left, FIG. 1B shows the symbol used in FIG. 1A for a (second) transducer, while the central representation indicates the electrode structure of the transducer. Every transducer (or partial transducer) includes first and second current bus bars SS1, SS2, from which alternating interdigitated electrode fingers EF emerge, so that two electrode combs, one inserted into the other, result. In the representation at the right, the impedance $Z_0$ of the transducer is illustrated by a corresponding circuit symbol. A transducer with a given number of electrode fingers EF and an aperture $A_0$ is assigned a standard impedance $Z_0$ of 50Ω below. It is assumed that all transducers have the same surface area. In reality of course, one can deviate from this standard impedance $Z_0$ by appropriate dimensioning.

Figure 1C:
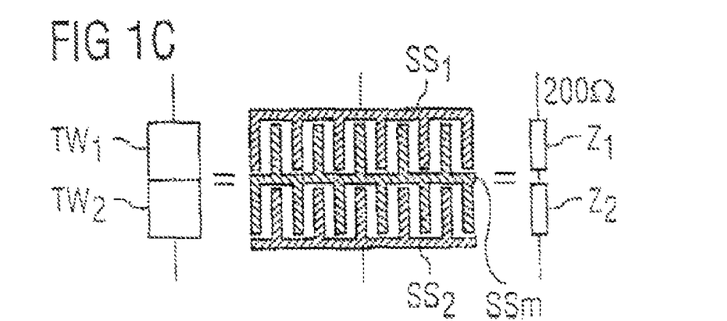

FIG. 1C shows a transducer in which two partial transducers are connected in series. The left part of the figure shows the first transducer with series-connected partial transducers in the mode of representation used in FIG. 1A and the additional FIGS. 2-7, while the middle representation again indicates the electrode structure of such a transducer composed of partial transducers. This transducer has a central current bus bars $SS_m$ whose electrode fingers EF overlap both those of first current bus bar SS1 and those of second current bus bar SS2. Because of the smaller aperture of the partial transducers, which corresponds here to half the output aperture $A_0$ because of the division by two, the impedance $Z_1$ of the first partial transducer is about $2*Z_0$. For the second partial transducer as well, $Z_2=2*Z_0$. For a standard impedance $Z_0=50Ω$, a total impedance $Z_A$ at the output of $Z_A=4*Z_0=200Ω$ results for the transducer composed of two partial transducers in FIG. 1A.

Figure 1D:
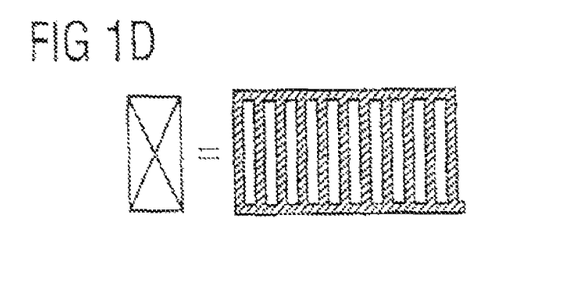

Finally, FIG. 1D shows an example of an electrode structure for a reflector structure REF as well as the symbol used for it.

While a subdivision into two partial transducers is shown in FIG. 1C, first transducer AW in FIG. 1A is subdivided into three partial transducers, with each partial transducer having, due to its modified individual aperture of $⅓*A_0$ in each case, three times the standard impedance $Z_0$. For the series circuit of three partial transducers this implies a total impedance of $9*Z_0$. At $Z_0=50Ω$ corresponding to the filter's input impedance of 25Ω (due to the parallel connection of the two second transducers EW), a value of 450Ω results for the impedance $Z_A$ at the output. This means that the filter illustrated in FIG. 1A produces an impedance transformation by a factor of 18 between input IN and output OUT. By connecting the two outer current bus bars of second transducer AW to a respective terminal of output OUT, one obtains a symmetric or balanced signal at the two terminals.

Figure 2:
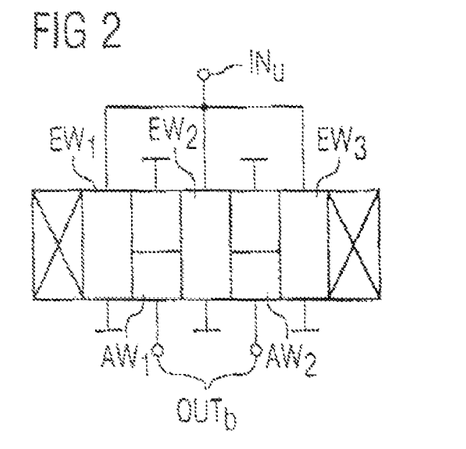
FIG. 2 shows an additional SAW filter with five transducers in a schematic representation.

FIG. 2 shows an additional embodiment of a filter that includes a total of five transducers, namely an alternating arrangement of three second and two first transducers. Second transducers $EW_1$, $EW_2$ and $EW_3$ are electrically in parallel to the asymmetric (unbalanced) input, and are connected to ground on their other side. The two first transducers $AW_1$, $AW_2$ are each subsided into two partial transducers. The two first transducers $AW_1$ and $AW_2$ are each connected to a respective terminal of a symmetric (balanced) output $OUT_b$ on one side of the acoustic path but to ground on the other side. This ground connection results in a series connection of the two first transducers. Because of the series connection of the two partial transducers inside each single transducer and the series connection of the two first transducers, a series circuit of four partial transducers results, each having an impedance of $2*Z_0$ in comparison with FIG. 2A. This means that, for equal transducer size, impedance transformation by a factor of 24 is effected from input side IN to output side OUT.

With an appropriate variation of the number of fingers and thus the transducer length, corresponding uneven or non-integer impedance transformations can be obtained or adjusted for this and all other embodiments. It is also possible for the number of fingers to be different for the first and second transducers. It is advantageous, however, always to use an equal number of electrode fingers within the group of first transducers relative to a central axis of symmetry perpendicular to the propagation direction of the acoustic wave. Only transducers with an identical number of fingers may be used in the group of second transducers.

Figure 3:
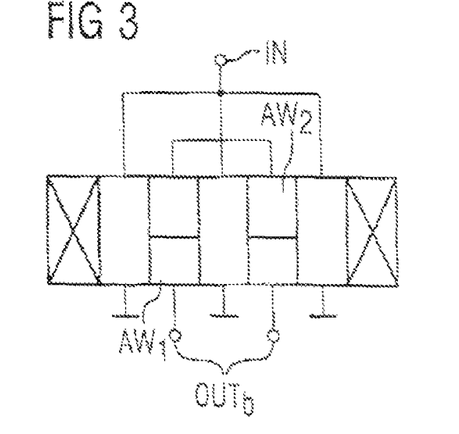
FIG. 3 shows a SAW filter with five transducers and two electrically connected first transducers.

While first transducers $AW_1$, $AW_2$ in FIG. 2 are connected to ground, the series connection of the two first transducers in the embodiment of FIG. 3 is accomplished via a thread-like electrical connection of the two first transducers $AW_1$, $AW_2$. It is possible, but not required, to connect the connection of the two first transducers to ground. The connection can also be floating. The filters of FIGS. 1 and 2 are otherwise identically constructed with regard to their electrode structures.

Figure 4:
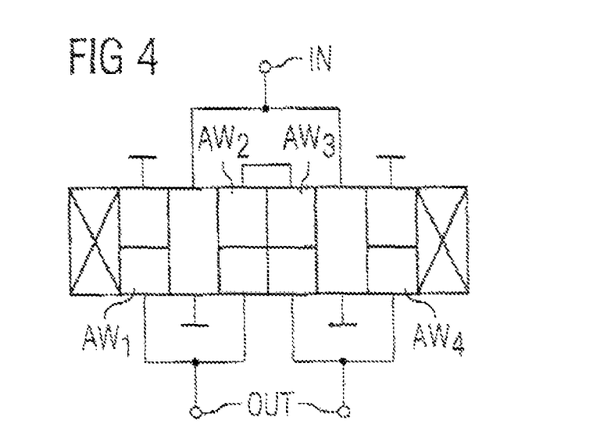
FIG. 4 shows a filter with six transducers and two connected first transducers.

FIG. 4 shows a SAW filter with four first transducers $AW_1$ through $AW_4$, and two second transducers $EW_1$, $EW_2$. Each of the two input transducers $EW_1$, $EW_2$ between two respective second transducers AW is connected electrically in parallel with unbalanced input $IN_u$ and ground. Two first transducers $AW_2$, $AW_3$ directly border one another and are electrically connected to one another at an external current bus bar. The two outer first transducers $AW_1$, $AW_4$ are connected to ground on the same side of the arrangement. On the other side of the acoustic path, two first transducers $AW_1$, $AW_2$ and $AW_3$, $AW_4$, respectively, are connected electrically and are connected to a terminal of balanced output $OUT_b$. Without subdivision, the numbers of fingers are selected such that impedance $Z_A$ at the output is, for instance, 200Ω for a standard impedance $Z_0$ of a (second) transducer. Now each of the first transducers AW is subdivided into two partial transducers connected in series, so that an individual impedance of four times output impedance $Z_0$ results for each first transducer. With the assumption that each output transducer AW (first transducer) has the initial impedance, the entire filter has an impedance transformation by a factor of 8 between input IN and output OUT.

Figure 5:
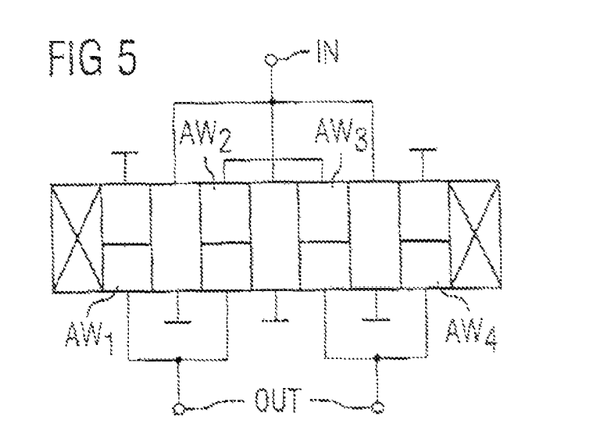
FIG. 5 shows a SAW filter with seven transducers and electrically connected central first transducers.

FIG. 5 shows a variation of this arrangement in which an additional second transducer is arranged between the two central first transducers $AW_2$ and $AW_3$, so that a filter with seven alternatingly arranged transducers overall results. Due to the subdivision of each first transducer into a series connection of two partial transducers, and due to the series connection of the two central first transducers, an impedance transformation by roughly a factor of 12 results here.

Figure 6:
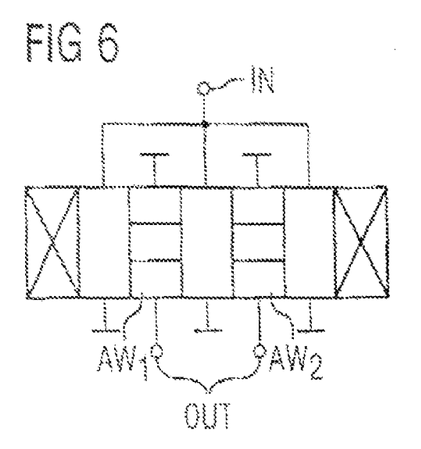
FIG. 6 shows a SAW filter with five transducers.

FIG. 6 shows an additional embodiment of a SAW filter that includes two first transducers and three alternatingly arranged second transducers EW. Each first transducer AW comprises a series connection of three partial transducers, and is connected on one side to a terminal of output OUT, and to ground on the other. This results in a series connection of the two first transducers $AW_1$, $AW_2$ between the two terminals of output OUT. Since each first transducer AW has nine times the standard impedance $Z_0$, a total impedance $Z_A=18*Z_0$ results at the output. For a typical standard impedance $Z_0=50Ω$, a value of 900Ω, thus an impedance transformation by the factor of 54 relative to input impedance $Z_E=Z_0/3$, results at the output.

Subdivisions into a larger number of partial transducers are possible as a variation of the illustrated subdivision of the first transducer into two or three partial transducers. Only the losses due to scattering and diffraction that must be accepted for excessively small individual apertures are to be considered limiting factors. In all embodiments, it is also possible to carry out the subdivision into partial transducers asymmetrically, so that the partial transducers can have different individual apertures. In all cases, however, it is advantageous to conduct a symmetrical subdivision in case there is more than one first transducer. SAW filters that are symmetrically constructed in relation to the arrangement of transducers are always advantageous.

Figure 7:
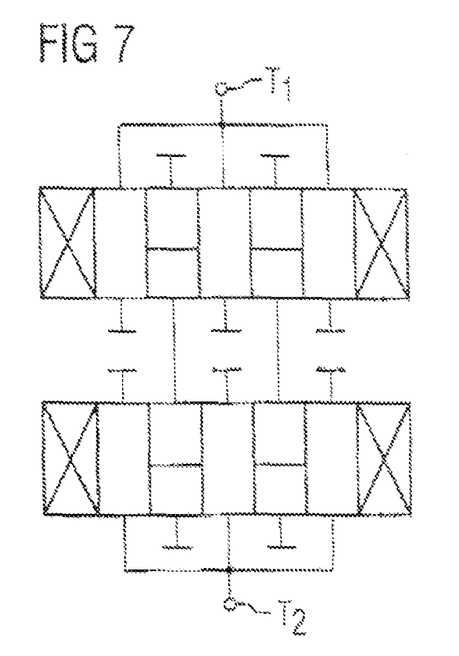
FIG. 7 shows an arrangement of two SAW filters that are connected in cascade to one another.

FIG. 7 shows an arrangement of two cascaded SAW filters, each of which is constructed as in FIG. 2, for example. They are cascaded via the side of the filter with the two symmetric terminals by simply connecting the two terminals for the output of each filter to one another.

An additional advantage that results for the arrangement according to FIG. 7 is that resistive losses are reduced by the coupling of the two bus bars via the high-resistance side. With the overall arrangement according to FIG. 7, the impedance transformation between the substructures has the aforementioned lower coupling losses, even if there is no impedance transformation between the two asymmetric terminals T1 and T2.

Figure 8:
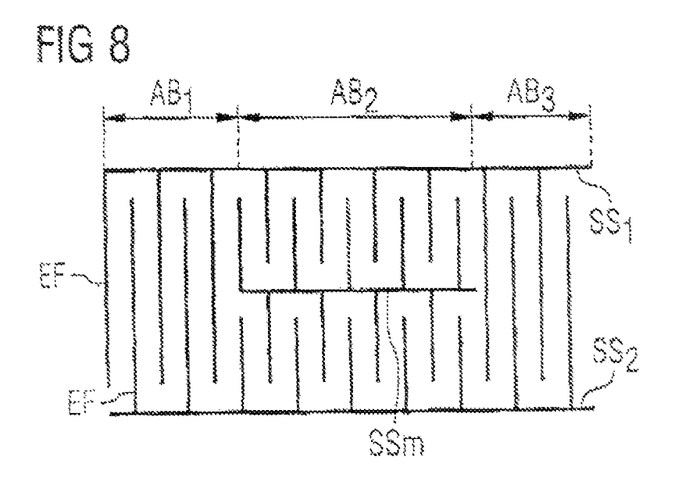
FIG. 8 shows a first transducer that is subdivided only in part into partial transducers.

FIG. 8 shows an additional embodiment, in which a first transducer is subdivided only in part into partial transducers. In the propagation direction of the acoustic wave, this transducer has a subdivision into three sections AB, all of which are electrically connected in parallel by virtue of the fact that, for instance, all transducers use two shared outer current bus bars SS1, SS2. Central current bus bar $SS_m$ runs here only in the area of central section AB2, so that only this central section AB2 is subdivided into two partial transducers TW1, TW2. In a transducer subdivided in this manner, it is possible to design the section lengths for transducer sections to be different. It is also possible to subdivide transducer sections AB into a different number of partial transducers. While the impedance is increased in the transducer sections that are subdivided into partial transducers, it remains unchanged in the sections that have no central current bus bar and therefore no subdivisions into partial transducers. The overall impedance of such a transducer is then calculated from the individual impedances of the transducer sections AB, analogously to a parallel circuit of resistors. To a first approximation, the individual impedances of the partial transducers behave inversely proportionally to the length of the respective section. This means that a longer transducer section AB2 subdivided into partial transducers leads to a higher impedance than does a corresponding transducer section of smaller length. A transducer subdivided in this manner can be used as a first transducer in all embodiments, and can completely replace the transducer completely subdivided into partial transducers there.

Figure 9:
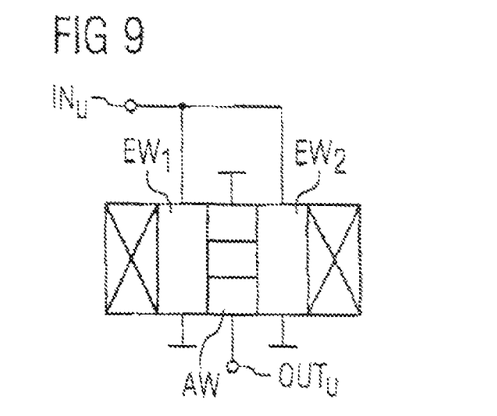
FIG. 9 shows a SAW filter connected asymmetrically on both sides.

FIG. 9 shows a variation in which a first transducer AW is subdivided into two partial transducers, and in which first transducer AW is connected unbalanced to ground and operated in that manner, in contrast to FIG. 1A.

Figure 10:
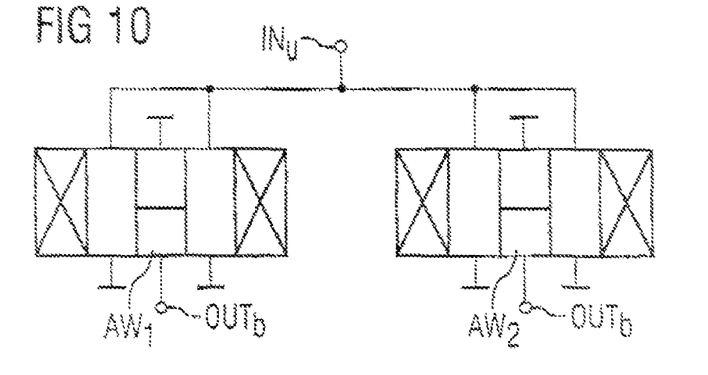
FIG. 10 shows a SAW filter subdivided onto two acoustic paths.

FIG. 10 shows a variant in which the transducers of the filter are distributed over two acoustic paths. Each acoustic path in this case is arranged between two reflectors. Each acoustic path comprises two second transducers EW connected in parallel, between which a respective first transducer AW is arranged. The second transducers of both acoustic paths are connected in parallel. Each first transducer AW is subdivided into two series-connected partial transducers, and is connected to a symmetric terminal of output OUT.

Figure 12:
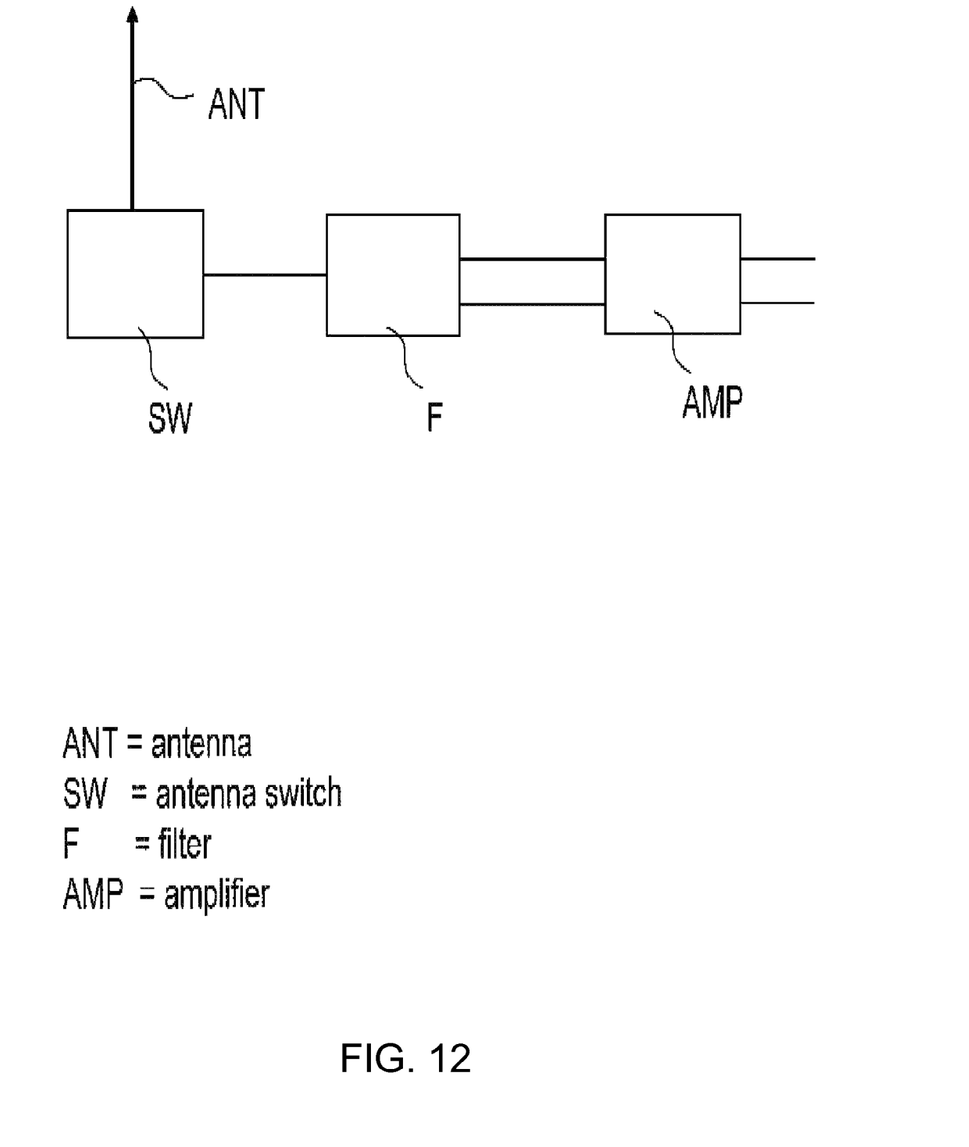
FIG. 12 shows use of an SAW filter in a path that includes an antenna, a switch, and an amplifier.

FIG. 12 shows use of a SAW filter (F) in the Rx path between an antenna (ANT) switch (SW) and an amplifier (AMP). The input side of the SAW filter F is connected to antenna switch SW, and the output side of the SAW filter F is connected to amplifier AMP, which may be a LNA amplifier. The antenna switch is connected to antenna ANT.

The claims are not limited to the embodiments described herein. It is possible, for instance, to arrange an arbitrary number of first and second transducers alternatingly. A symmetrical arrangement is may be preferred, wherein the axis of symmetry is arranged between two transducers in case of an even number of transducers, but in the center of a transducer, in case of an odd number of transducers. It is also possible for all transducers of a category, i.e., first or second transducers, to be constructed identically. On the other hand, first and second transducers can differ in individual parameters, particularly in the length of the transducers and thus in the number of electrode fingers. It is also possible, however, to use differing second transducers EW, which can differ in the number of electrode fingers or in transducer length. It is also possible, however, for second transducers EW to be subdivided into partial transducers. The subdivision of first transducers AW, however, is then such that an appropriately elevated impedance appears on the output side.

Filters can also be cascaded in any desired number. It is also possible for individual or multiple filters to be connected in series or in parallel to resonators, for instance, single-port resonators. The filters can be arranged on arbitrary piezoelectric substrates, e.g., on high-coupling substrates such as lithium niobate or lithium tantalate.

Filters of the type described herein may be used in the Rx branch of terminal devices in mobile communications, i.e., Rx path of cell phones.

The invention claimed is:

1. A surface acoustic wave (SAW) filter arrangement comprising an SAW filter, the SAW filter comprising:
   first electroacoustic transducers;
   at least one second electroacoustic transducer, the first electroacoustic transducers and the at least one second electroacoustic transducer being side-by-side in an acoustic path having an aperture $A_0$;
   wherein each first electroacoustic transducer is connected to an electrical output of the SAW filter, and the at least one second electroacoustic transducer is connected to an electrical input of the SAW filter;
   wherein each of the first electroacoustic transducers comprises a series circuit comprised of a number n partial transducers, each of the partial transducers having an individual aperture $A_j$, with j=1, 2, ... n and 1<n<6, where a sum of the individual apertures $A_j$ is equal to an aperture $A_0$ of the acoustic path;
   wherein at least two of the first electroacoustic transducers are connected in series;
   wherein the first electroacoustic transducers comprise bus bars that are on a first side of the acoustic path and that are connected to an electrical output;
   wherein there are an even number m of first electroacoustic transducers, with m≧4;
   wherein all electroacoustic transducers in the SAW filter are arranged symmetrically in relation to an axis of symmetry that is perpendicular to a propagation direction of an acoustic wave along the SAW filter;
   wherein first electroacoustic transducers on both sides of the axis of symmetry are connected to an electrical output that is among two parallel branches;
   wherein, on the second side of the acoustic path, first electroacoustic transducers are connected in one of the following ways:
   a) all first electroacoustic transducers are connected to ground; or
   b) two innermost first electroacoustic transducers, which are closest to the axis of symmetry, are connected in series, and other first electroacoustic transducers are connected to ground.

2. The SAW filter arrangement of claim 1, wherein at least one first electroacoustic transducer comprises, in a propagation direction of a surface wave, parallel-connected transducer sections, the transducer sections being subdivided into partial transducers.

3. The SAW filter arrangement of claim 1, wherein at least one first electroacoustic transducer comprises transducer sections comprising a central bus bar that extends, as viewed parallel to a propagation direction of an acoustic wave, across one of the transducer sections; and wherein the central bus bar does not extend across at least one transducer section.

4. The SAW filter arrangement of claim 1, wherein there are plural second electroacoustic transducers that are all connected in parallel, that are connected to a common asymmetric terminal via terminals of the plural second electrostatic transducers, and that are connected to ground.

5. The SAW filter arrangement of claim 1, further comprising:

reflectors that bound the acoustic path.

6. The SAW filter arrangement of claim 1, which is in a signal path between an antenna and an amplifier of a receive branch of a radio device.

7. An input filter in a receive path of radio device comprising the SAW filter arrangement of claim 1.

8. A path comprising:
an antenna switch;
an LNA amplifier having a differential input; and
the SAW filter arrangement of claim 1.

* * * * *